(12) United States Patent
Xia et al.

(10) Patent No.: US 12,369,296 B2
(45) Date of Patent: Jul. 22, 2025

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Jun Xia, Hefei (CN); Tao Liu, Hefei (CN); Qiang Wan, Hefei (CN); Jungsu Kang, Hefei (CN); Kangshu Zhan, Hefei (CN); Sen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 935 days.

(21) Appl. No.: 17/599,695

(22) PCT Filed: Jun. 11, 2021

(86) PCT No.: PCT/CN2021/099869
§ 371 (c)(1),
(2) Date: Sep. 29, 2021

(87) PCT Pub. No.: WO2022/028112
PCT Pub. Date: Feb. 10, 2022

(65) Prior Publication Data
US 2023/0059079 A1    Feb. 23, 2023

(30) Foreign Application Priority Data
Aug. 5, 2020   (CN) .......................... 202010778879.8

(51) Int. Cl.
*H01L 21/027* (2006.01)
*H01L 21/033* (2006.01)
(Continued)

(52) U.S. Cl.
CPC ....... *H10B 12/033* (2023.02); *H01L 21/0274* (2013.01); *H01L 21/0332* (2013.01);
(Continued)

(58) Field of Classification Search
CPC ............. H01L 21/0274; H01L 21/0332; H01L 21/0337; H01L 21/31144; H10B 12/033;
(Continued)

(56) References Cited

U.S. PATENT DOCUMENTS 5,895,947 A    4/1999   Lee et al.
6,713,236 B2   3/2004   Chen
(Continued)

FOREIGN PATENT DOCUMENTS

CN    1172347 A     2/1998
CN    101877306 A   11/2010
(Continued)

OTHER PUBLICATIONS

International Search Report cited in PCT/CN2021/099869 mailed Aug. 26, 2021, 8 pages.

*Primary Examiner* — Omar F Mojaddedi
(74) *Attorney, Agent, or Firm* — Syncoda LLC; Feng Ma

(57) ABSTRACT

The present disclosure provides a manufacturing method of a semiconductor structure and a semiconductor structure. The manufacturing method includes: providing a substrate, where the substrate includes a complete die region and an incomplete die region; forming a stack on the substrate, where the stack includes sacrificial layers and supporting layers; forming a first photoresist layer on the stack; exposing the first photoresist layer, and developing to remove the first photoresist layer on the incomplete die region; and etching the stack by using the first photoresist layer on the complete die region as a mask.

14 Claims, 15 Drawing Sheets

(51) Int. Cl.
  *H01L 21/311* (2006.01)
  *H10B 12/00* (2023.01)
(52) U.S. Cl.
  CPC .... *H01L 21/0337* (2013.01); *H01L 21/31144* (2013.01); *H10B 12/09* (2023.02); *H10B 12/31* (2023.02); *H10B 12/50* (2023.02)
(58) Field of Classification Search
  CPC ........ H10B 12/09; H10B 12/31; H10B 12/50; H10B 12/00; H10B 12/30; H10B 12/02
  See application file for complete search history.

(56) References Cited

U.S. PATENT DOCUMENTS

| | | | |
|---|---|---|---|
| 2017/0077103 A1* | 3/2017 | Park | H10D 1/716 |
| 2017/0200616 A1* | 7/2017 | Min | H01L 21/3086 |
| 2021/0118886 A1* | 4/2021 | Choi | H10B 12/50 |
| 2021/0272817 A1* | 9/2021 | Choi | H01L 21/31144 |
| 2021/0272961 A1* | 9/2021 | Tung | H10B 12/34 |
| 2022/0005818 A1* | 1/2022 | Tanaka | H01L 21/76816 |

FOREIGN PATENT DOCUMENTS

| | | |
|---|---|---|
| CN | 111025845 A | 4/2020 |
| JP | 2012209350 A | 10/2012 |
| JP | 2014179511 A | 9/2014 |
| KR | 20080033798 A | 4/2008 |
| KR | 20100081018 A | 7/2010 |

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure claims the benefit and priority of Chinese Patent Application No. 202010778879.8, filed with China National Intellectual Property Administration (CNIPA) on Aug. 5, 2020 and titled "MANUFACTURING METHOD OF SEMICONDUCTOR STRUCTURE AND SEMICONDUCTOR STRUCTURE", the disclosure of which is incorporated by reference herein in its entirety as part of the present disclosure.

TECHNICAL FIELD

The present disclosure relates to, but is not limited to, a manufacturing method of a semiconductor structure and a semiconductor structure.

BACKGROUND

As a commonly used semiconductor memory device in computers, dynamic random access memory (DRAM) is composed of many repeated memory cells. Each memory cell typically includes a capacitor and a transistor. In the transistor, the gate is connected to the word line, the drain is connected to the bit line, and the source is connected to the capacitor. The voltage signal on the word line controls the transistor to turn on or off, and then the data information stored in the capacitor is read through the bit line, or data information is written into the capacitor through the bit line for storage.

With the evolution of the manufacturing process, the integration level of the DRAM is increasing, and the lateral size of the component is constantly shrinking, which leads to a higher aspect ratio of the capacitor, making the manufacturing process more difficult. Specifically, the pattern on the incomplete die region at the edge of the wafer may collapse and peel off during the etching process, which will cause contamination of the wafer and the wafer processing chamber, thereby reducing the yield of the product.

SUMMARY

An overview of the subject matter detailed in the present disclosure is provided below, which is not intended to limit the protection scope of the claims.

According to some embodiments, the present disclosure provides a manufacturing method of a semiconductor structure. The manufacturing method includes: providing a substrate, where the substrate includes a complete die region and an incomplete die region; forming a stack on the substrate, where the stack includes sacrificial layers and supporting layers; forming a first photoresist layer on the stack; exposing the first photoresist layer, and developing to remove the first photoresist layer on the incomplete die region; and etching the stack by using the first photoresist layer on the complete die region as a mask.

The present disclosure provides a semiconductor structure, which is formed by the above manufacturing method of a semiconductor structure.

Other aspects of the present disclosure are understandable upon reading and understanding the drawings and detailed description.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are a part rather than all of the embodiments of the present disclosure. Persons of ordinary skill in the art can obtain other drawings based on these drawings without creative efforts.

DETAILED DESCRIPTION

The present disclosure proposes a manufacturing method of a semiconductor structure and a semiconductor structure, which are described below with reference to the accompanying drawings and specific implementations.

Figure 1:
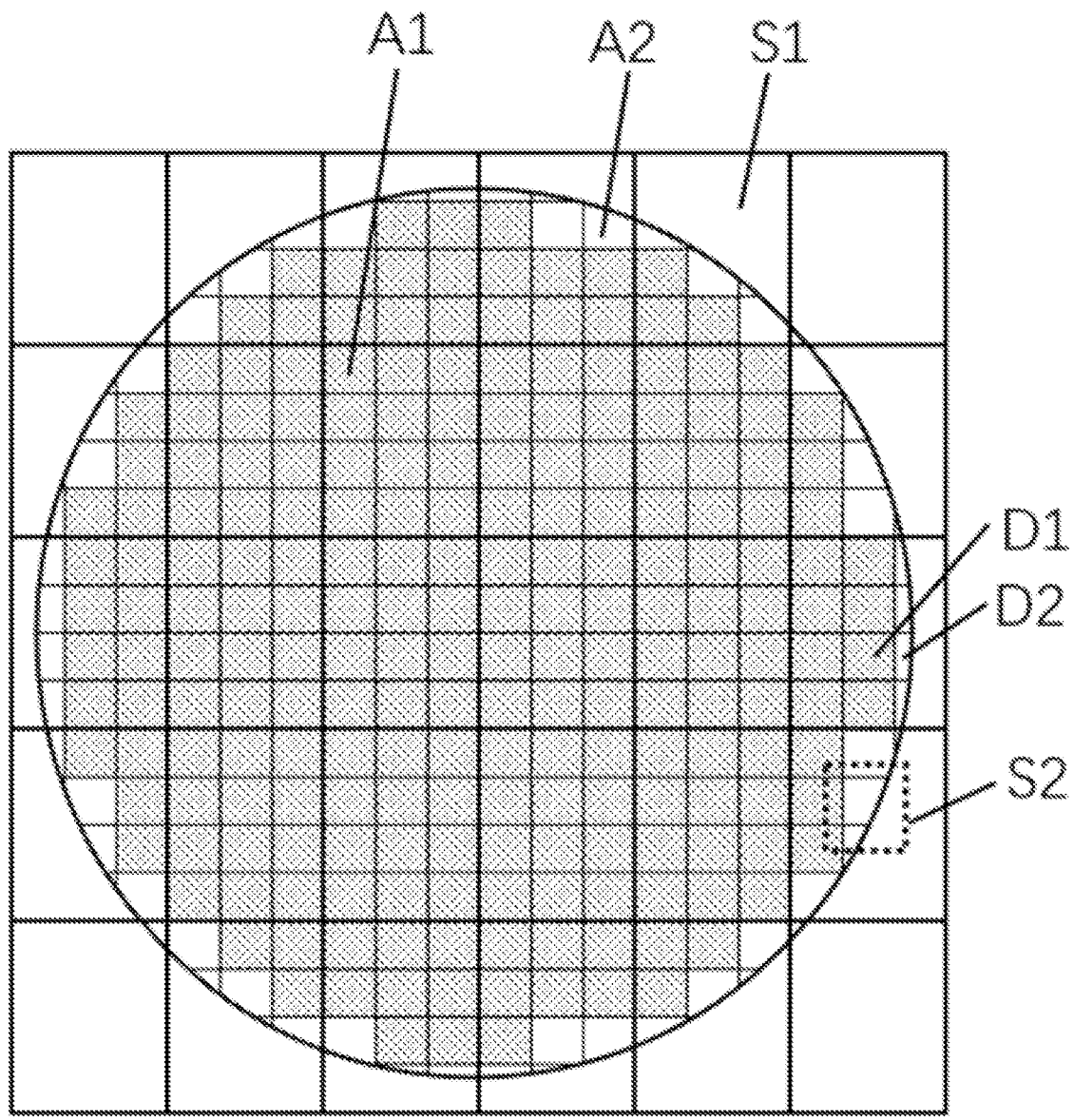
FIG. 1 is a schematic diagram of a wafer according to an embodiment of the present disclosure.
Figure 2:
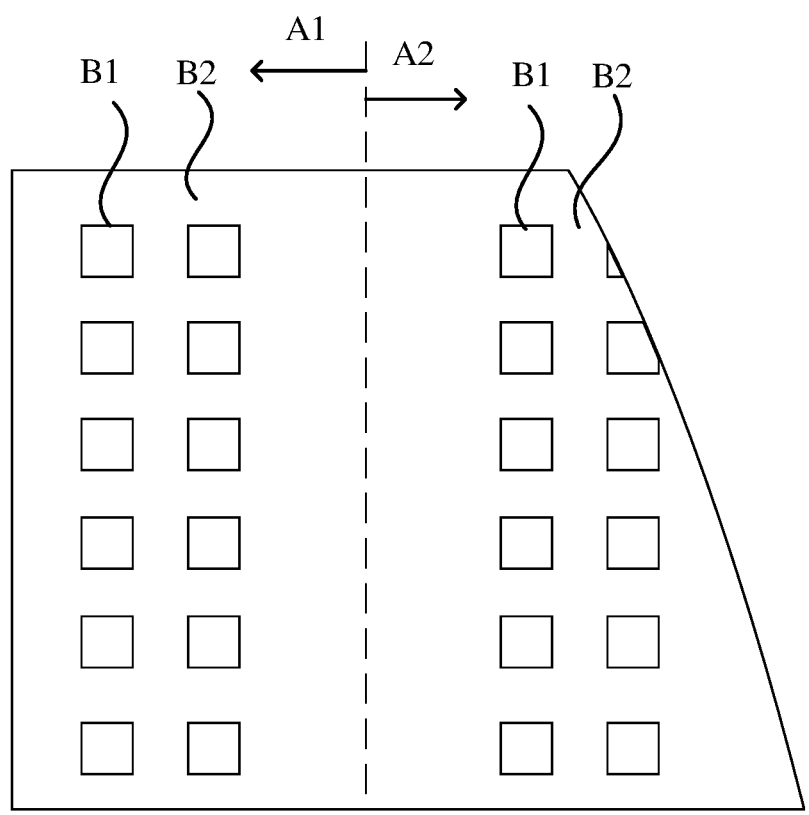
FIG. 2 is an enlarged partial view of a complete die D1 and an incomplete die D2 shown in FIG. 1.

FIG. 1 is a schematic diagram of a wafer according to an embodiment of the present disclosure; FIG. 2 is an enlarged partial view of a complete die D1 and an incomplete die D2 shown in FIG. 1. Referring to FIGS. 1 and 2, a wafer is exposed to form a complete die region A1 and an incomplete die region A2 by using an exposure map composed of a plurality of exposure units S1. A single exposure unit S1 is a region for a single exposure by using a photomask. A single exposure unit S1 may include a plurality of dies. For example, as shown in FIG. 1, a single exposure unit S1 includes 12 dies arranged in 4 rows and 3 columns.

The wafer includes a complete die region A1 and an incomplete die region A2. The complete die region A1 is composed of complete dies D1 inside the wafer, and the incomplete die region A2 is composed of incomplete dies D2 at the periphery of the wafer.

The incomplete die region A2 is located at the periphery of the complete die region A1. The complete die D1 is a die that is completely on the wafer; the incomplete die D2 is a die that is partially on the wafer. The complete die D1 includes a device region B1 and a peripheral region B2, and the peripheral region B2 surrounds the device region B1. The incomplete die D2 also includes a device region B1 and a peripheral region B2, and the peripheral region B2 surrounds the device region B1.

Figure 3:
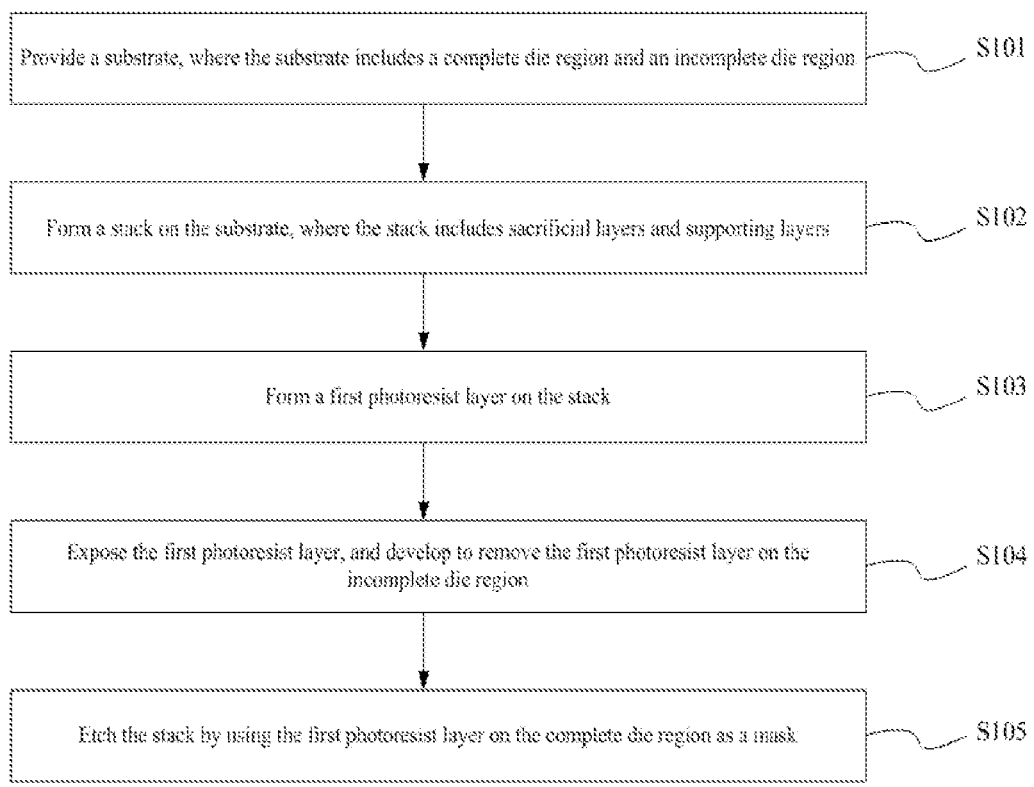
FIG. 3 is a flowchart of a manufacturing method of a semiconductor structure according to an embodiment of the present disclosure.

FIG. 3 is a flowchart of a manufacturing method of a semiconductor structure according to an embodiment of the present disclosure; FIGS. 5 to 18 show the manufacturing process of the semiconductor structure according to the embodiment. Referring to FIG. 3 and FIGS. 5 to 18, the manufacturing method of a semiconductor structure includes:

S101: Provide a substrate 10, where the substrate 10 includes a complete die region A1 and an incomplete die region A2.

The substrate 10 may be made of monocrystalline silicon, polycrystalline silicon, amorphous silicon, silicon-germanium or silicon-on-insulator (SOI). The substrate 10 may also be a wafer on which a semiconductor structure is formed. For example, a semiconductor device, or an active area of a memory array or a peripheral circuit, etc., is formed on the wafer. The incomplete die region A2 is located at the periphery of the complete die region A1, and the incomplete die region A2 may surround the complete die region A1 in a circle.

S102: Form a stack on the substrate 10, where the stack includes sacrificial layers and supporting layers.

In this step, sacrificial layers and supporting layers stacked alternately are formed on the substrate 10. Exemplarily, the stack includes a first supporting layer 21, a first sacrificial layer 31, a second supporting layer 22, a second sacrificial layer 32 and a third supporting layer 23 along a direction away from the substrate 10. In other implementations, the stack may also include other numbers of sacrificial layers and other numbers of supporting layers, which is not limited in the embodiment of the present disclosure.

S103: Form a first photoresist layer PR1 on the stack.

In this step, the first photoresist layer PR1 is formed on the stack covering the complete die region A1 and the incomplete die region A2.

S104: Expose the first photoresist layer PR1, and develop to remove the first photoresist layer PR1 on the incomplete die region A2.

In this step, the first photoresist layer PR1 is exposed and developed to remove the first photoresist layer PR1 on the incomplete die region A2 and retain the first photoresist layer PR1 on the complete die region A1. In this way, no pattern will be formed on the first photoresist layer PR1 on the incomplete die region A2. Exemplarily, the first photoresist layer PR1 may be exposed by using a partial exposure method, and developed to remove the first photoresist layer PR1 on the incomplete die region A2. In some feasible implementations, partial exposure may be achieved, for example, by step exposure. The step exposure method will be further introduced below.

In this step, the first photoresist layer PR1 is exposed by partial exposure. For example, only the first photoresist layer PR1 on the complete die region A1 is exposed, or only the first photoresist layer PR1 on the incomplete die region A2 is exposed. The first photoresist layer PR1 on the complete die region A1 and that on the incomplete die region A2 are not exposed at the same time, such that after the development, the first photoresist layer PR1 on the incomplete die region A2 is removed, and the first photoresist layer PR1 on the complete die region A1 is retained.

S105: Etch the stack by using the first photoresist layer PR1 on the complete die region A1 as a mask.

In the manufacturing method of a semiconductor structure provided by the embodiment of the present disclosure, the first photoresist layer PR1 is exposed and developed to remove the first photoresist layer PR1 on the incomplete die region A2 and retain the first photoresist layer PR1 on the complete die region A1. In this way, no pattern will be formed on the first photoresist layer PR1 on the incomplete die region A2. When the stack on the substrate 10 is etched, the stack on the incomplete die region A2 is prevented from being etched and patterned, thereby solving the problem that the edge of the wafer is prone to collapse and peeling during the formation of the semiconductor structure.

In an embodiment, referring to FIGS. 5 to 18, the manufacturing method of a semiconductor structure further includes:

Step 1: Form a first mask layer on the stack, where the first photoresist layer PR1 is located on the first mask layer.

In this step, the first mask layer is formed on the stack on the complete die region A1 and on the stack on the incomplete die region A2.

In an embodiment, the first mask layer includes a multilayer film structure. Exemplarily, the first mask layer may include a lower mask layer 40 and an upper mask layer 51. The lower mask layer 40 and the upper mask layer 51 may be combined layers commonly used in a semiconductor manufacturing process, for example, an amorphous carbon layer and a silicon oxynitride layer, and a silicon oxide layer and a silicon nitride layer, etc. In other examples, the first mask layer may be a multilayer film structure with more than two layers. For example, the upper mask layer 51 may further include a barrier layer (for example, a first barrier layer) and a mandrel layer (for example, a first mandrel layer). The mandrel layer is used to form a mandrel in a self-aligned double patterning (SADP) process. The multilayer film structure may be set according to actual process requirements, which is not limited here.

Step 2: Etch the first mask layer by using the first photoresist layer PR1 on the complete die region A1 as a mask.

In this step, since the first photoresist layer PR1 on the incomplete die region A2 is removed, on the incomplete grain area A2, there is no first photoresist layer PR1, and the first mask layer will not be patterned.

Step 3: Etch the stack by using the first mask layer as a mask.

In the embodiment of the present disclosure, a first mask layer may further be formed on the stack, and a first photoresist layer PR1 may be formed on the first mask layer. When the first photoresist layer PR1 on the complete die region A1 is used as a mask to etch the stack, Step 2 in the embodiment of the present disclosure may be carried out first before Step 3 in the embodiment of the present disclosure.

In an embodiment, the first photoresist layer PR1 is a positive photoresist layer. The first photoresist layer PR1 on the incomplete die region A2 is exposed and developed to remove the first photoresist layer PR1 on the incomplete die region A2 and retain the first photoresist layer PR1 on the complete die region A1. Specifically, when the first photoresist layer PR1 is a positive photoresist layer, the step exposure method may be used to expose the first photoresist layer PR1 on the incomplete die region A2. Since the incomplete die region A2 is only located at the periphery of the wafer and has a small area, the step exposure method to expose the first photoresist layer PR1 on the incomplete die region A2 can save the exposure time and reduce the production cost. During subsequent development, the first photoresist layer PR1 on the non-exposed complete die region A1 is retained, and the first photoresist layer PR1 on the exposed incomplete die region A2 is removed.

In an embodiment, the step exposure is carried out without using a photomask, and a light spot in the step exposure at least covers a single complete die. Since the first photoresist layer PR1 on the incomplete die region A2 needs to be removed, a maskless exposure method may be adopted, and a light spot S2 that can cover the area of a single complete die is used for exposure, which ensures the exposure effect and effectively reduces the cost.

In an embodiment, the area of the light spot S2 in the step exposure method is smaller than that of a single exposure unit S1.

In an embodiment, the light spot S2 in the step exposure method exactly completely covers the area of a single complete die, which reduces the area of the light source, reduces the power consumption of the light source and saves the production cost.

In an embodiment, the first photoresist layer PR1 is a positive photoresist layer. The exposing the first photoresist layer PR1 includes: expose the first photoresist layer PR1 on the complete die region A1, and develop to form a first pattern on the first photoresist layer PR1 on the complete die region A1; and expose the first photoresist layer PR1 on the incomplete die region A2, and develop to remove the first photoresist layer PR1 on the incomplete die region A2. For example, a photomask with a first pattern is used to expose the first photoresist layer PR1 on the complete die region A1; the first photoresist layer PR1 on the incomplete die region A2 is exposed without using a photomask. After the development, a first pattern is formed on the first photoresist layer PR1 on the complete die region A1. Since the first photoresist layer PR1 of the incomplete die region A2 is fully exposed without using a photomask, the first photoresist layer PR1 on the incomplete die region A2 is completely removed after the development.

In an embodiment, the exposure of the first photoresist layer PR1 on the incomplete die region A2 is carried out before that of the first photoresist layer PR1 on the complete die region A1. Specifically, first, the first photoresist layer PR1 on the incomplete die region A2 is fully exposed without using a photomask. Then, the first photoresist layer PR1 on the complete die region A1 is exposed by using a photomask, and the first pattern on the photomask is transferred to the first photoresist layer PR1 on the complete die region A1. Finally, a development process is carried out to form the first pattern on the first photoresist layer PR1 on the complete die region A1 and remove the first photoresist layer PR1 on the incomplete die region A2. The exposure amount required to remove the first photoresist layer PR1 on the incomplete die region A2 is large. In order to avoid the influence of the scattered light with a large exposure amount on the complete die region A1, it is necessary to carry out the exposure of the first photoresist layer PR1 on the incomplete die region A2 in advance.

In an embodiment, the first photoresist layer PR1 on the complete die region A1 is exposed by using an immersion lithography machine or an extreme ultraviolet lithography (EUVL) machine; the first photoresist layer PR1 on the incomplete die region A2 is exposed by using an I-line lithography machine or a KrF lithography machine. Since the first photoresist layer PR1 of the complete die region A1 needs to form a fine first pattern, the high-resolution immersion lithography machine or EUVL machine is used for exposure. The incomplete die region A2 does not need to be patterned, so the I-line lithography machine or the KrF lithography machine is sufficient to expose the first photoresist layer PR1 on the incomplete die region A2, which can save the process cost.

In an embodiment, the manufacturing method further includes: etch to transfer the first pattern of the complete die region A1 to the first mask layer and remove the first mask layer on the incomplete die region A2.

In an embodiment, after forming the first pattern on the first photoresist layer PR1, the manufacturing method further includes: reduce a pitch of the first pattern by using an SADP or self-aligned quadruple patterning (SAQP) process. Specifically, the first mask layer includes a lower mask layer, an upper mask layer, a first barrier layer and a first mandrel layer. Etching is carried out to transfer the first pattern to the first mandrel layer, and a first sidewall layer is conformally formed on the first pattern of the first mandrel layer. Etching is carried out to remove the first sidewall layer between the first patterns and on the top of the first pattern and retain the first sidewall layer on a sidewall of the first pattern.

In an embodiment, the first photoresist layer PR1 is a negative photoresist layer. The first photoresist layer PR1 on the complete die region A1 is exposed and developed to remove the first photoresist layer PR1 on the incomplete die region A2. In the embodiment of the present disclosure, the first photoresist layer PR1 is a negative photoresist layer. The first photoresist layer PR1 on the complete die region A1 is exposed by using a photomask, and the first photoresist layer PR1 on the incomplete die region A2 is not exposed. During subsequent development, a required photolithographic pattern is formed on the first photoresist layer PR1 on the complete die region A1. Since the first photoresist layer PR1 on the incomplete die region A2 is not exposed, it is removed through development. Therefore, compared with the use of a positive photoresist layer, the design of the negative photoresist layer reduces the two exposure processes into one exposure process, which simplifies the process.

Figure 4:
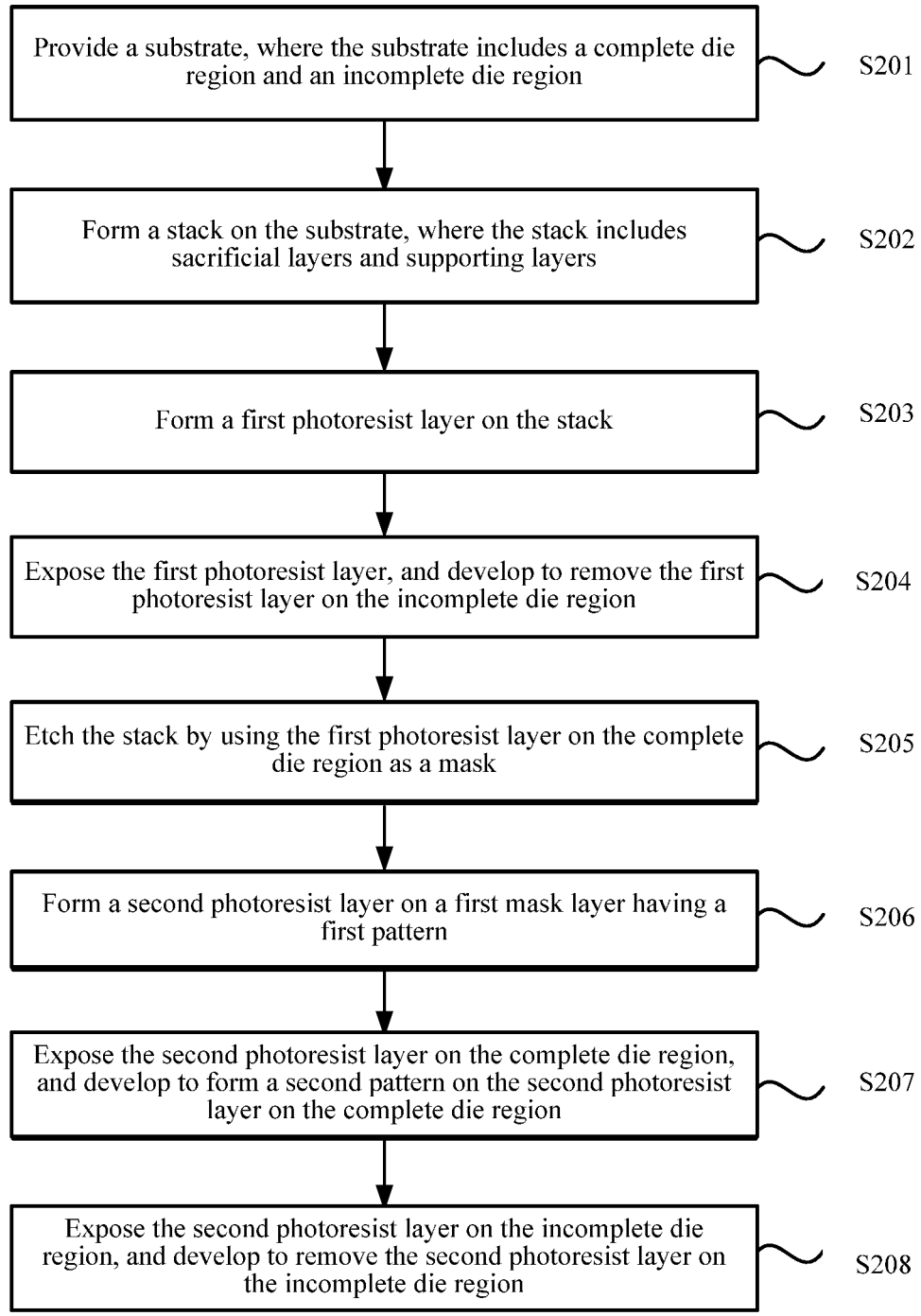
FIG. 4 is a flowchart of another manufacturing method of a semiconductor structure according to an embodiment of the present disclosure.
Figure 5:
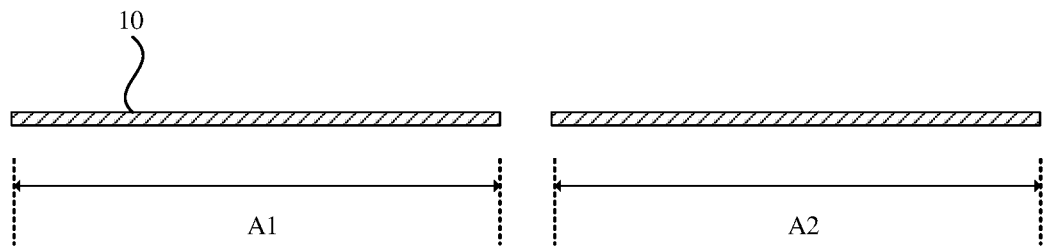
FIG. 5 is a schematic diagram of a substrate formed by Step S101 of the manufacturing method of a semiconductor structure shown in FIG. 3.
Figure 6:
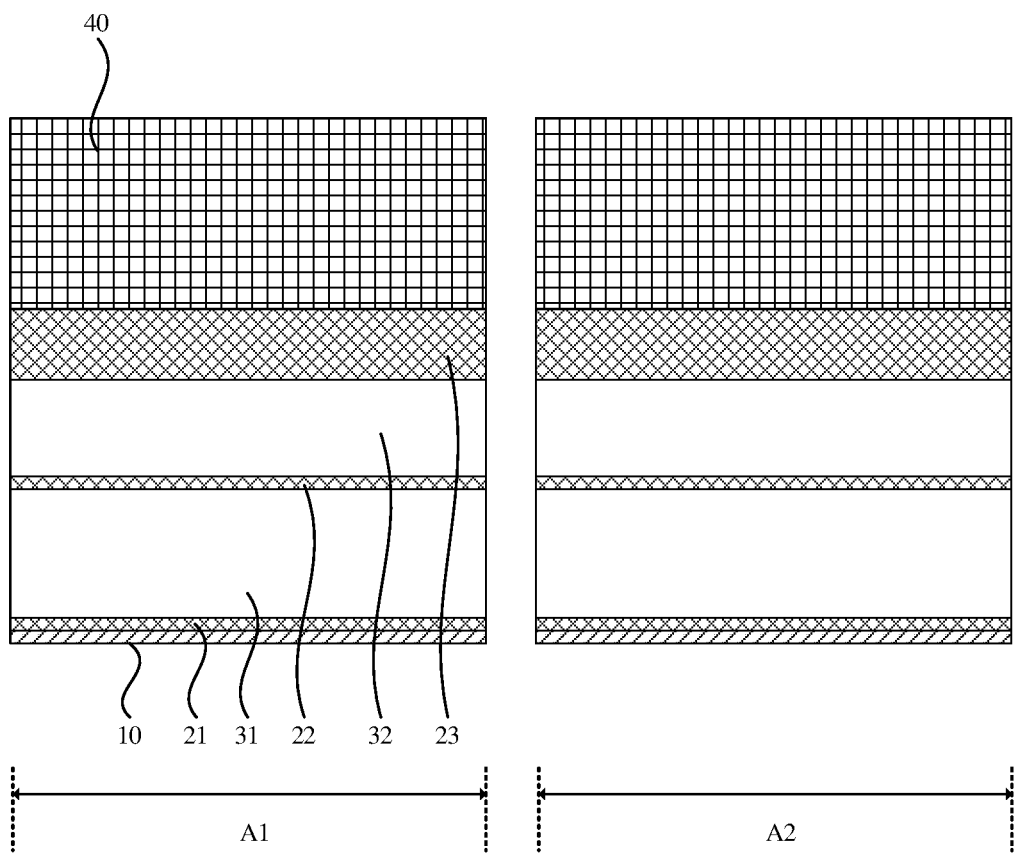
FIG. 6 is a schematic diagram of a first mask layer formed on a stack by Step S102 of the manufacturing method of a semiconductor structure shown in FIG. 3.
Figure 7:
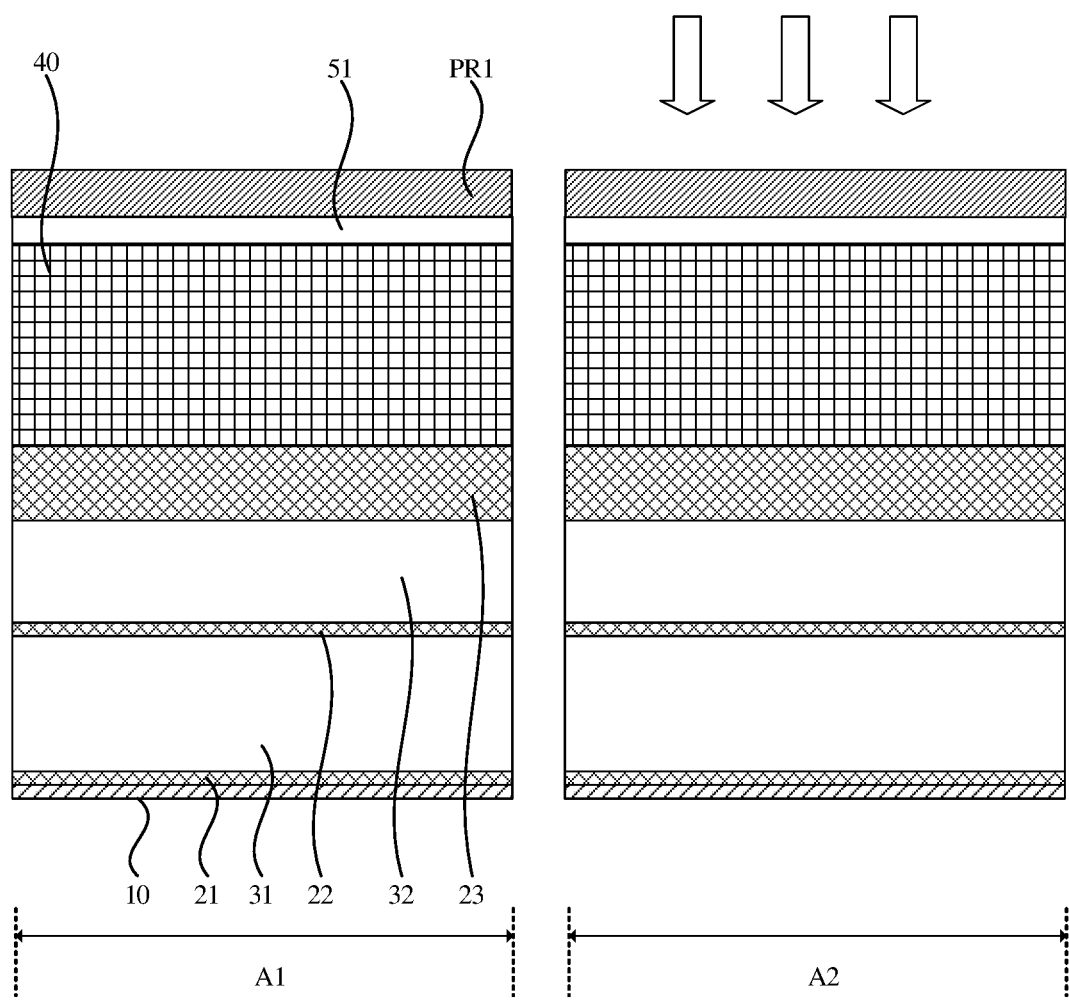
FIG. 7 is a schematic diagram of a structure obtained after implementing Step S103 of the manufacturing method of a semiconductor structure shown in FIG. 3.
Figure 8:
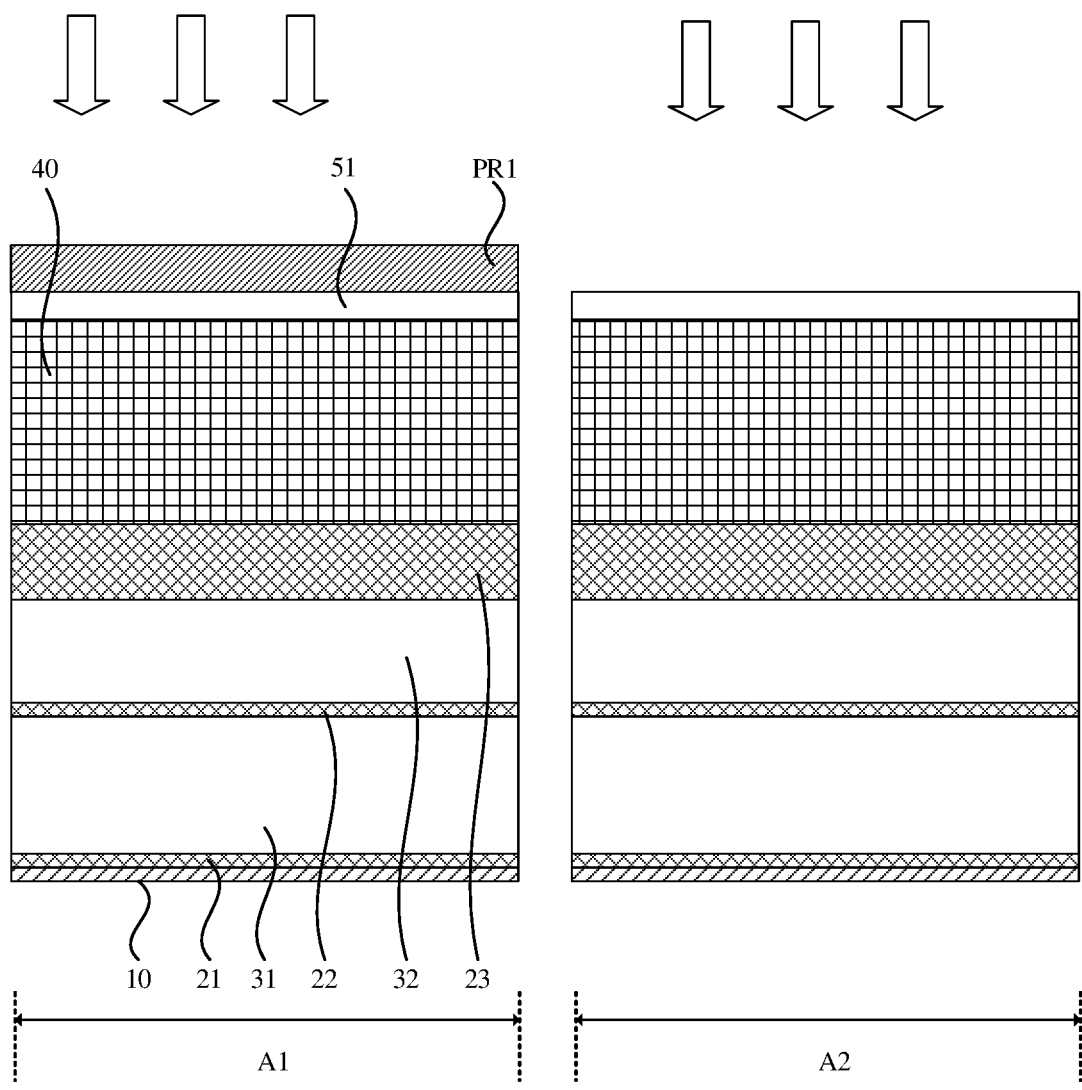
FIG. 8 is a schematic diagram of a structure obtained after implementing Step S104 of the manufacturing method of a semiconductor structure shown in FIG. 3.
Figure 9:
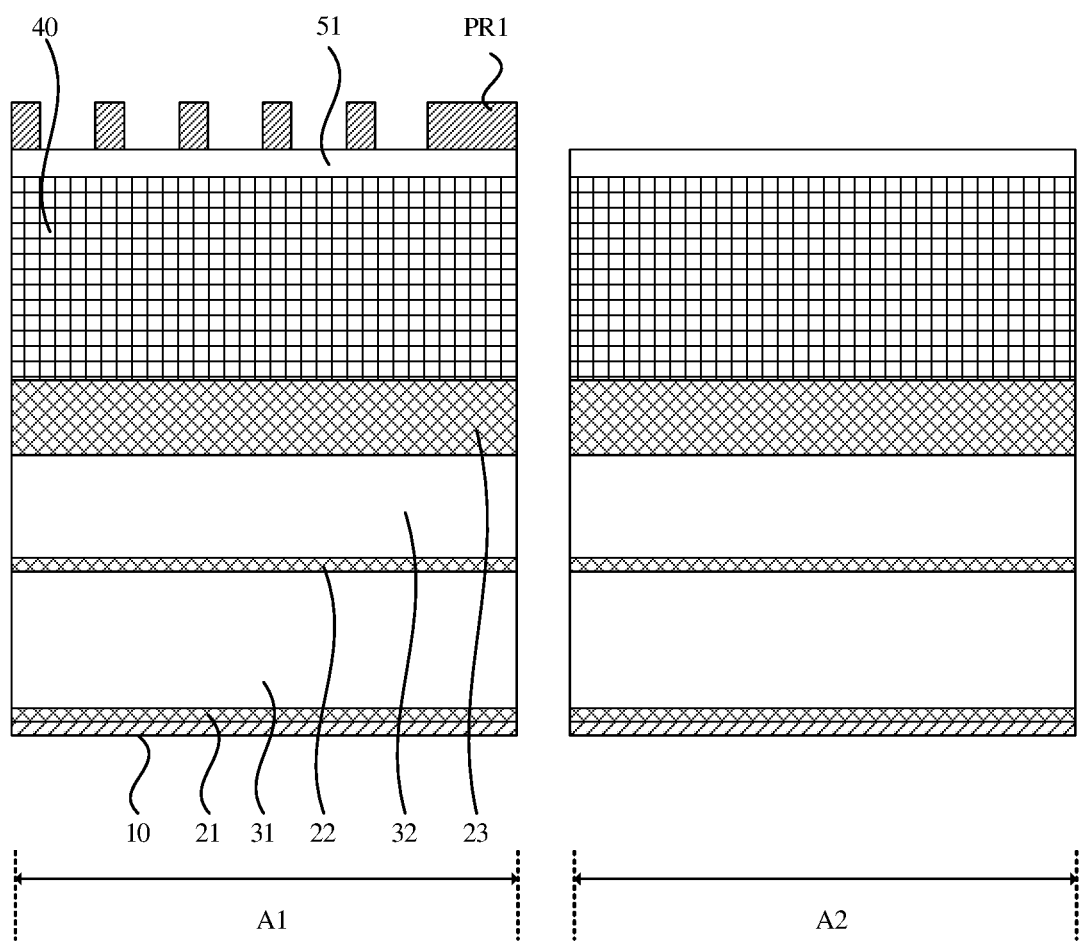
FIG. 9 is a schematic diagram of a structure obtained after implementing Step S105 of the manufacturing method of a semiconductor structure shown in FIG. 3.
Figure 10:
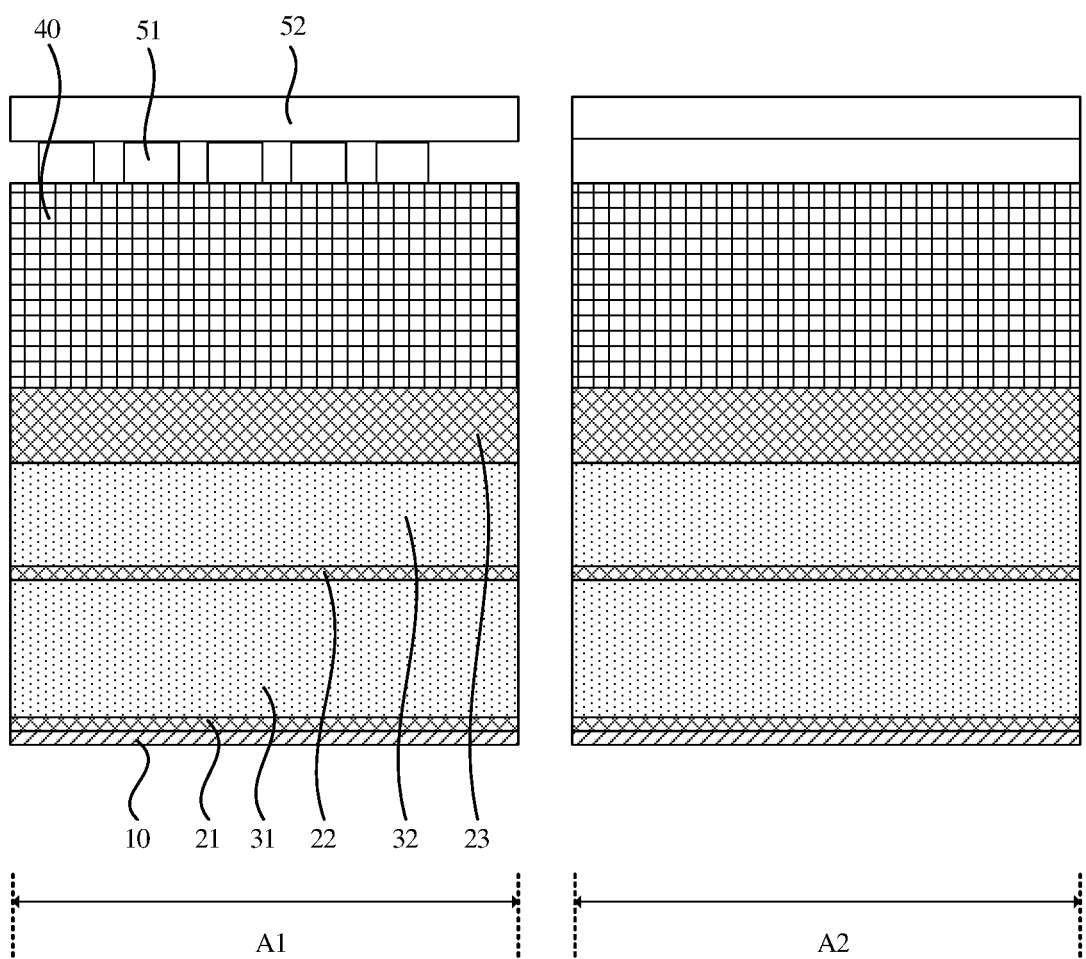
FIG. 10 is a schematic diagram of a second mask layer 52 formed before implementing Step S206 of the manufacturing method of a semiconductor structure shown in FIG. 4.
Figure 11:
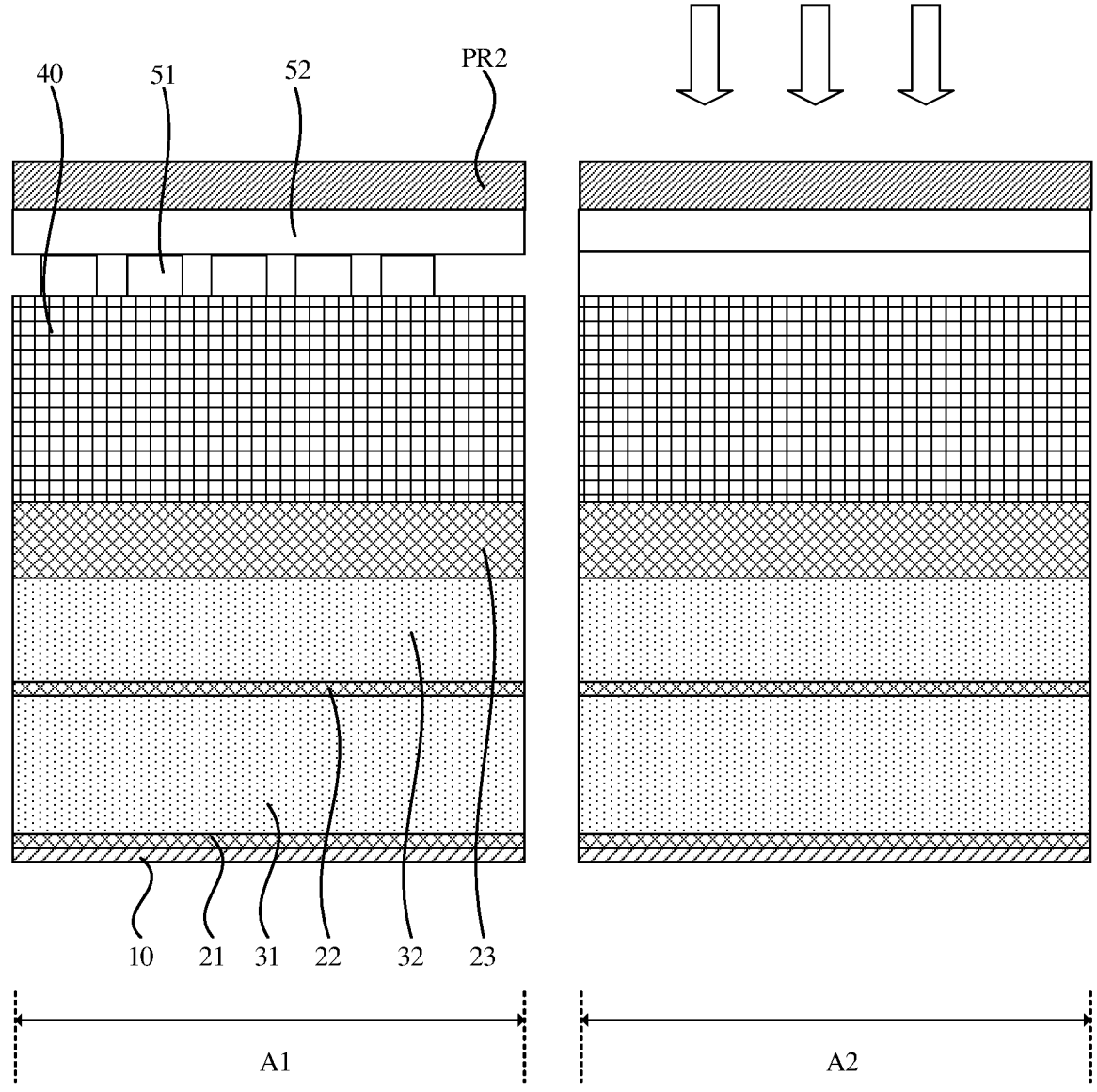
FIG. 11 is a schematic diagram of a structure obtained after implementing Step S206 of the manufacturing method of a semiconductor structure shown in FIG. 4.
Figure 12:
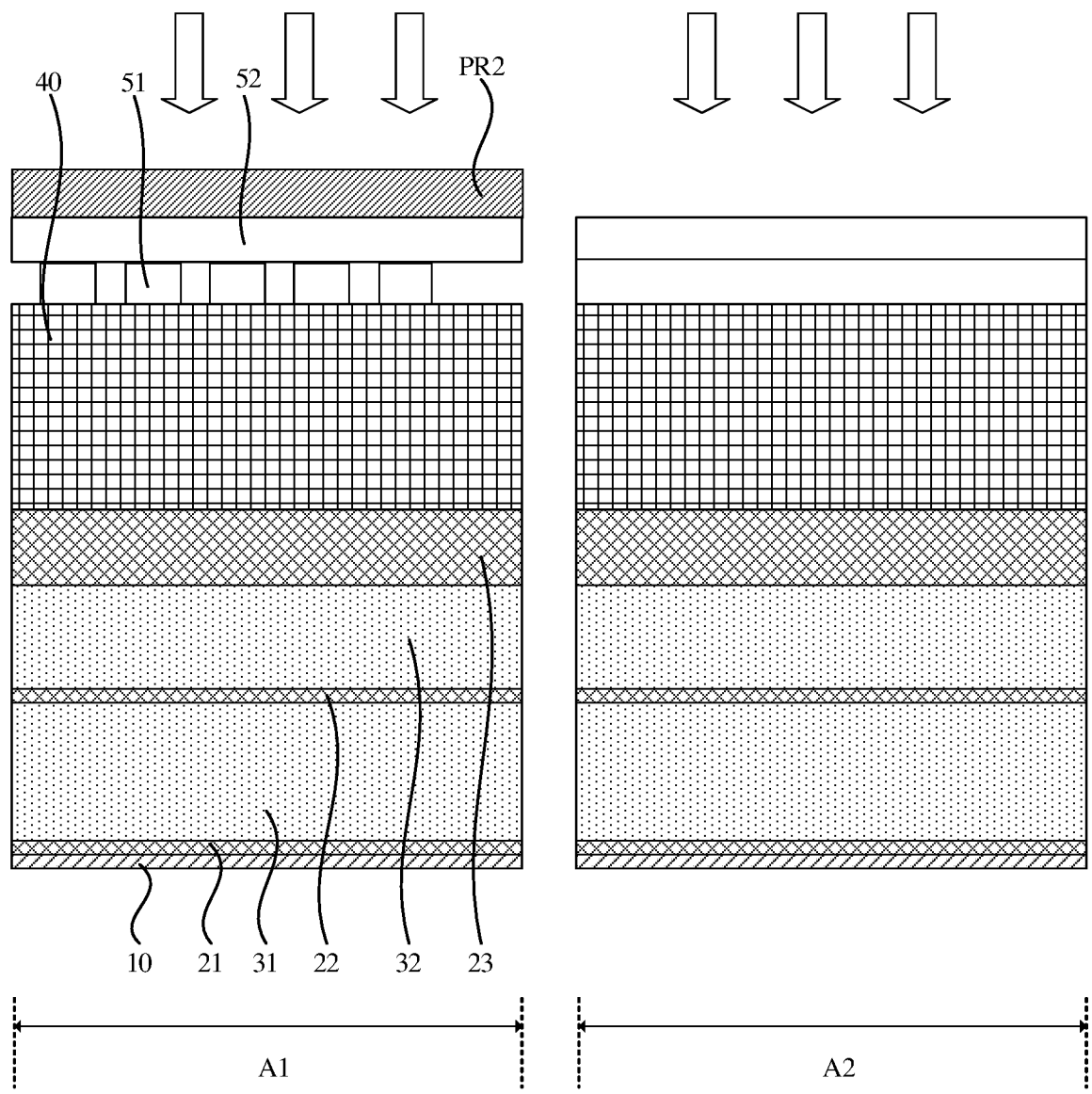
FIG. 12 is a schematic diagram of exposing a second photoresist layer PR2 by Step S207 of the manufacturing method of a semiconductor structure shown in FIG. 4.
Figure 13:
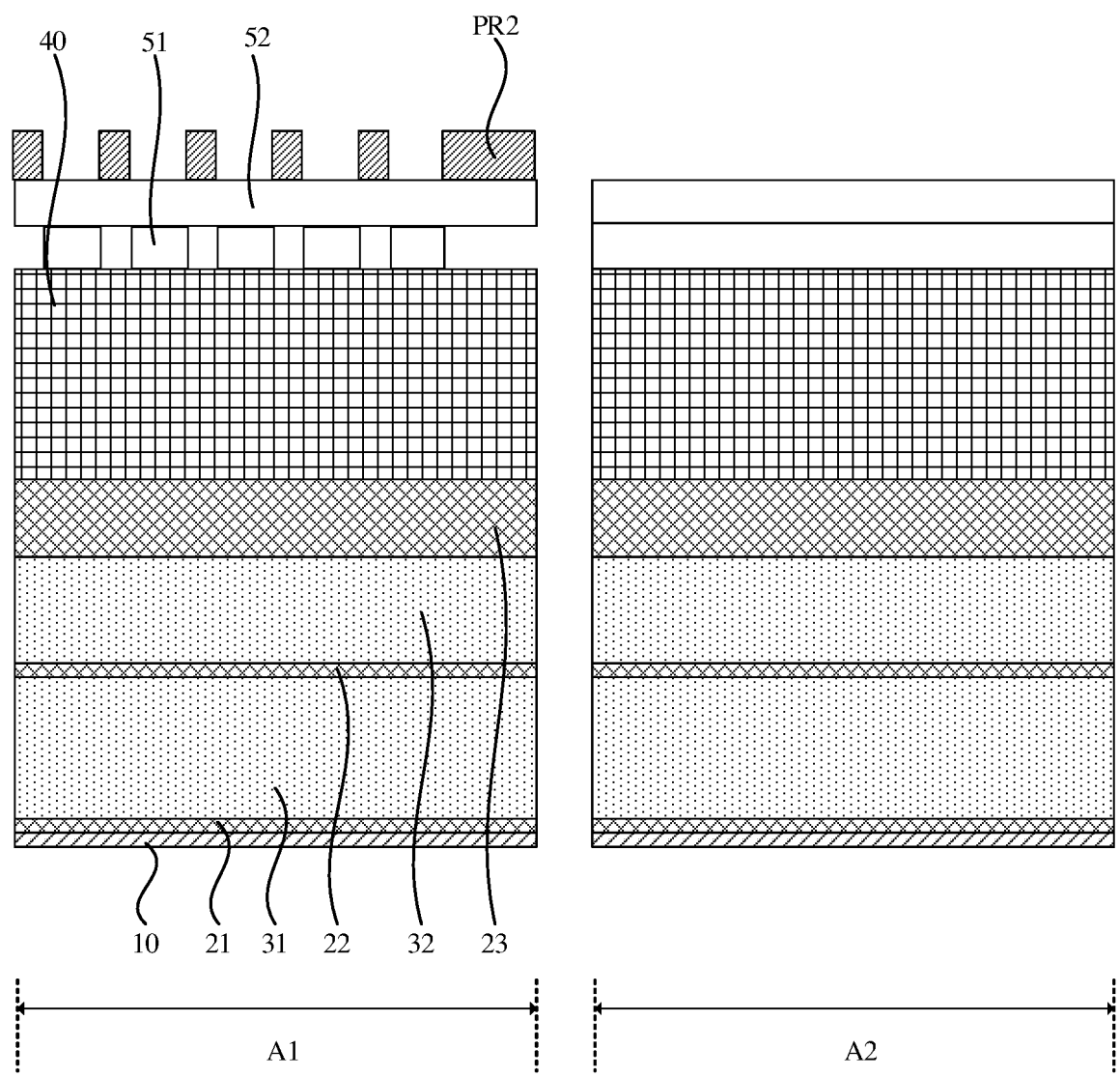
FIG. 13 is a schematic diagram of a structure obtained after implementing Step S207 of the manufacturing method of a semiconductor structure shown in FIG. 4.
Figure 14:
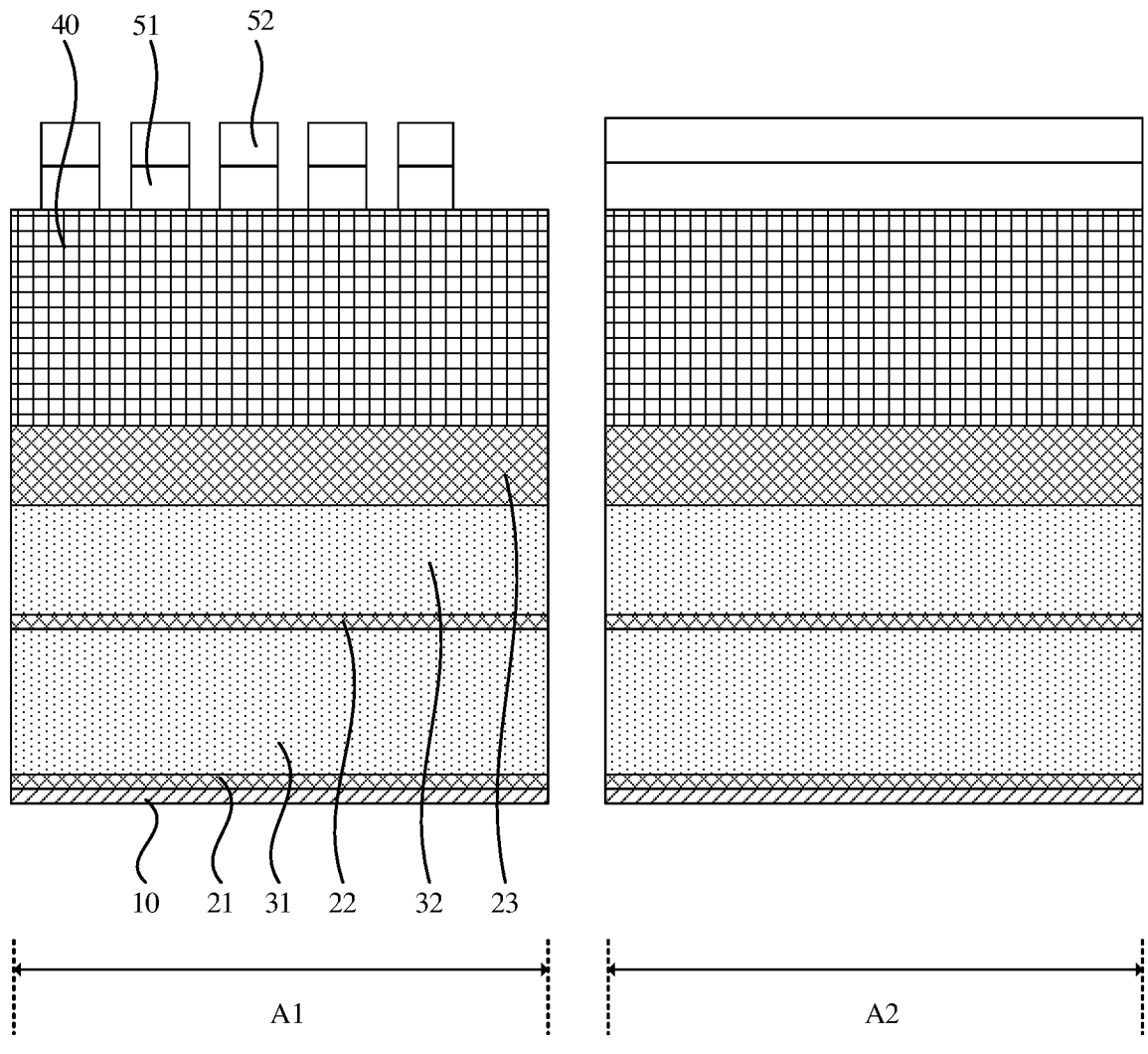
FIG. 14 is a schematic diagram of a structure obtained after reducing a pitch of a second pattern after implementing Step S208 of the manufacturing method of a semiconductor structure shown in FIG. 4.
Figure 15:
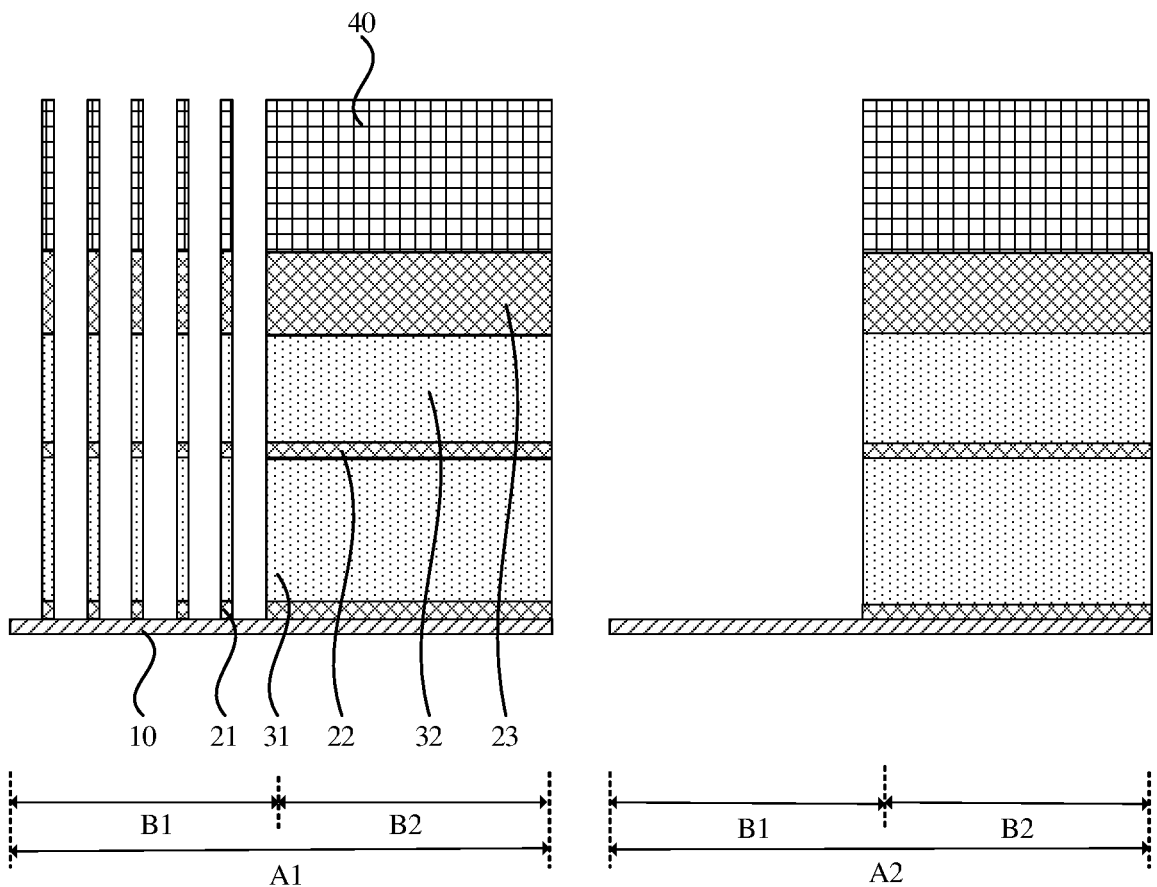
FIG. 15 is a schematic diagram of capacitor holes formed after implementing steps S207 and S208 of the manufacturing method of a semiconductor structure shown in FIG. 4.
Figure 16:
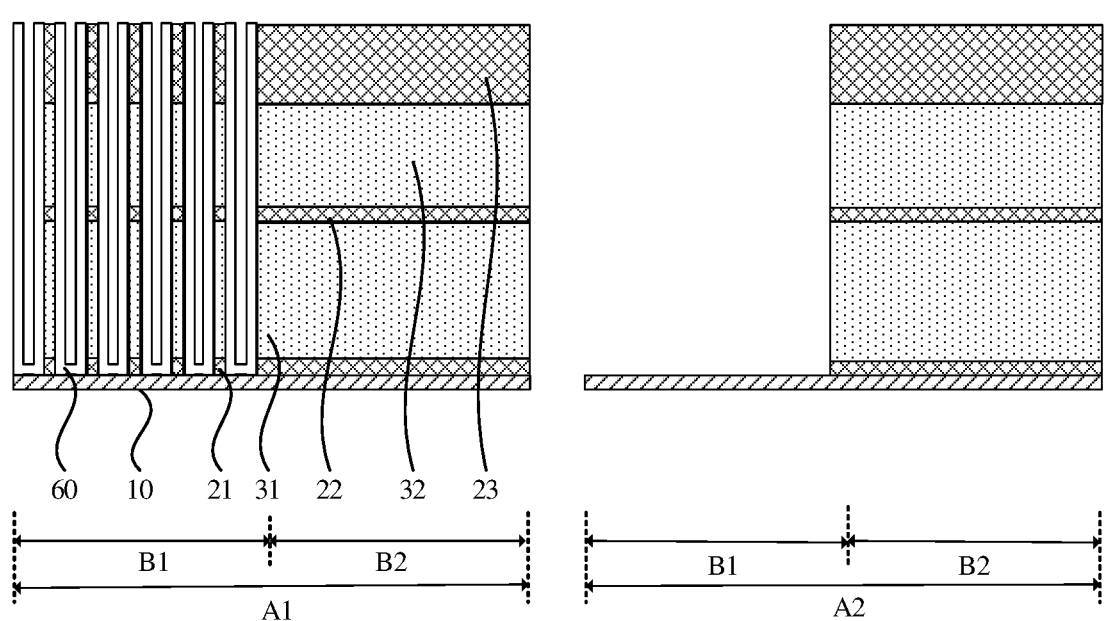
FIG. 16 is a schematic diagram of bottom electrodes formed after implementing steps S207 and S208 of the manufacturing method of a semiconductor structure shown in FIG. 4.

FIG. 4 is a flowchart of another manufacturing method of a semiconductor structure according to an embodiment of the present disclosure; FIGS. 5 to 18 show the manufacturing process of the semiconductor structure according to the embodiment. Referring to FIG. 4 and FIGS. 5 to 18, the manufacturing method of a semiconductor structure includes:

S201: Provide a substrate 10, where the substrate 10 includes a complete die region A1 and an incomplete die region A2.

S202: Form a stack on the substrate 10, where the stack includes sacrificial layers and supporting layers.

S203: Form a first photoresist layer PR1 on the stack.

S204: Expose the first photoresist layer PR1, and develop to remove the first photoresist layer PR1 on the incomplete die region A2.

S205: Etch the stack by using the first photoresist layer PR1 on the complete die region A1 as a mask.

S206: Form a second photoresist layer PR2 on the first mask layer having the first pattern.

In this step, the second photoresist layer PR2 is formed on the first mask layer covering the complete die region A1 and the incomplete die region A2.

S207: Expose the second photoresist layer PR2 on the complete die region A1, and develop to form a second pattern on the second photoresist layer PR2 on the complete die region A1.

In this step, the second photoresist layer PR2 is a positive photoresist layer. The second photoresist layer PR2 on the complete die region A1 is exposed and developed to form a second pattern on the second photoresist layer PR2 on the complete die region A1. Specifically, a photomask with a second pattern may be used to expose the second photoresist layer PR2 on the complete die region A1, and then development may be carried out to form a second pattern on the second photoresist layer PR2 on the complete die region A1.

In other embodiments, the second photoresist layer PR2 is a negative photoresist layer. When the second photoresist layer PR2 is a negative photoresist layer, the subsequent Step S208 may be omitted, and the second photoresist layer PR2 on the incomplete die region A2 is removed after the development.

S208: Expose the second photoresist layer PR2 on the incomplete die region A2, and develop to remove the second photoresist layer PR2 on the incomplete die region A2.

In this step, the second photoresist layer PR2 on the incomplete die region A2 is removed, and the second photoresist layer PR2 on the complete die region A1 is retained. Specifically, when the second photoresist layer PR2 is a positive photoresist layer, the step exposure method may be used to expose the second photoresist layer PR2 on the incomplete die region A2. Since the incomplete die region A2 is only located at the periphery of the wafer and has a small area, the step exposure method to expose the second photoresist layer PR2 on the incomplete die region A2 can save the exposure time and reduce the production cost. During subsequent development, the second photoresist layer PR2 on the non-exposed complete die region A1 is retained, and the second photoresist layer PR2 on the exposed incomplete die region A2 is removed.

In other implementations, Step S208 is carried out first before Step S207. That is, first, the second photoresist layer PR2 of the incomplete die region A2 is exposed, and developed to remove the second photoresist layer PR2 of the incomplete die region A2. Then, the second photoresist layer PR2 on the complete die region A1 is exposed, and developed to form a second pattern on the second photoresist layer PR2 on the complete die region A1.

In an embodiment, the first pattern is a linear pattern (not shown in the figure) extending in a first direction, and the second pattern is a linear pattern (not shown in the figure) extending in a second direction. The first direction and the second direction are not parallel. In other words, the first direction intersects the second direction. In the embodiment of the present disclosure, a region in which the first pattern intersects the second pattern is one where capacitor holes need to be formed by etching. The design of the first pattern and the second pattern facilitates the formation of small capacitor holes.

In an embodiment, after forming the second first pattern on the second photoresist layer PR2, the manufacturing method further includes: reduce a pitch of the second pattern by using an SADP or SAQP process. Specifically, a second mask layer is formed on the first mask layer on which the first pattern is formed. The second mask layer includes a second barrier layer and a second mandrel layer. A second photoresist layer PR2 with a second pattern is formed on the second mask layer. Etching is carried out to transfer the second pattern into the second mandrel layer, and a second sidewall layer is conformally formed on the second pattern in the second mandrel layer. Etching is carried out to remove the second sidewall layer between the second patterns and on the top of the second pattern and retain the second sidewall layer on a sidewall of the second pattern.

In an embodiment, referring to FIGS. 5 to 18, before Step S206, the manufacturing method of a semiconductor structure further includes: form a second mask layer 52 on the first mask layer with a first pattern. In this step, the second mask layer 52 is formed on the first mask layer on the complete die region A1, and the second mask layer 52 is formed on the first mask layer on the incomplete die region A2.

In an embodiment, referring to FIGS. 5 to 18, after Steps S207 and S208, the manufacturing method of a semiconductor structure may further include:

Step 1: Etch the stack by using the first pattern and the second pattern as a mask to form capacitor holes in the stack.

Step 2: Form bottom electrodes 60 on the bottoms and sidewalls of the capacitor holes.

In this step, a metal layer is formed in the capacitor holes. A part of the metal layer above the capacitor holes is removed by a planarization or etching process, and a part of the metal layer in the capacitor holes is retained to form the bottom electrodes 60. The planarization process may be, for example, a chemical mechanical polishing (CMP) process.

In an embodiment, referring to FIGS. 5 to 18, after forming bottom electrodes 60 on the bottoms and sidewalls of the capacitor holes, the manufacturing method of a semiconductor structure may further include:

Step 1: Form a third photoresist layer PR3 on the stack in which the capacitor holes are formed.

Before this step, capacitor holes may be formed in the stack. Further, before this step, bottom electrodes 60 may further be formed in the capacitor holes.

In this step, the third photoresist layer PR3 is formed by covering the complete die region A1 and the incomplete die region A2. The third photoresist layer PR3 may be a positive photoresist layer or a negative photoresist layer.

Step 2: Form a third pattern on the third photoresist layer PR3.

The third pattern at least intersects the bottom electrodes 60 on the sidewalls of the capacitor holes. Exemplarily, the third photoresist layer PR3 has opening patterns distributed in an array in the device region B1 of the complete die region A1, and the opening patterns intersect the sidewalls of the capacitor holes. Specifically, in a direction perpendicular to the substrate 10, the opening patterns intersect projections of the capacitor holes. The opening patterns intersect the sidewalls of the capacitor holes. Therefore, in this step, the bottom electrodes 60 and the supporting layers exposed by the opening patterns may be partially etched away, thereby forming openings exposing the sacrificial layer, so as to remove at least one sacrificial layer by wet etching in a subsequent process.

Figure 17:
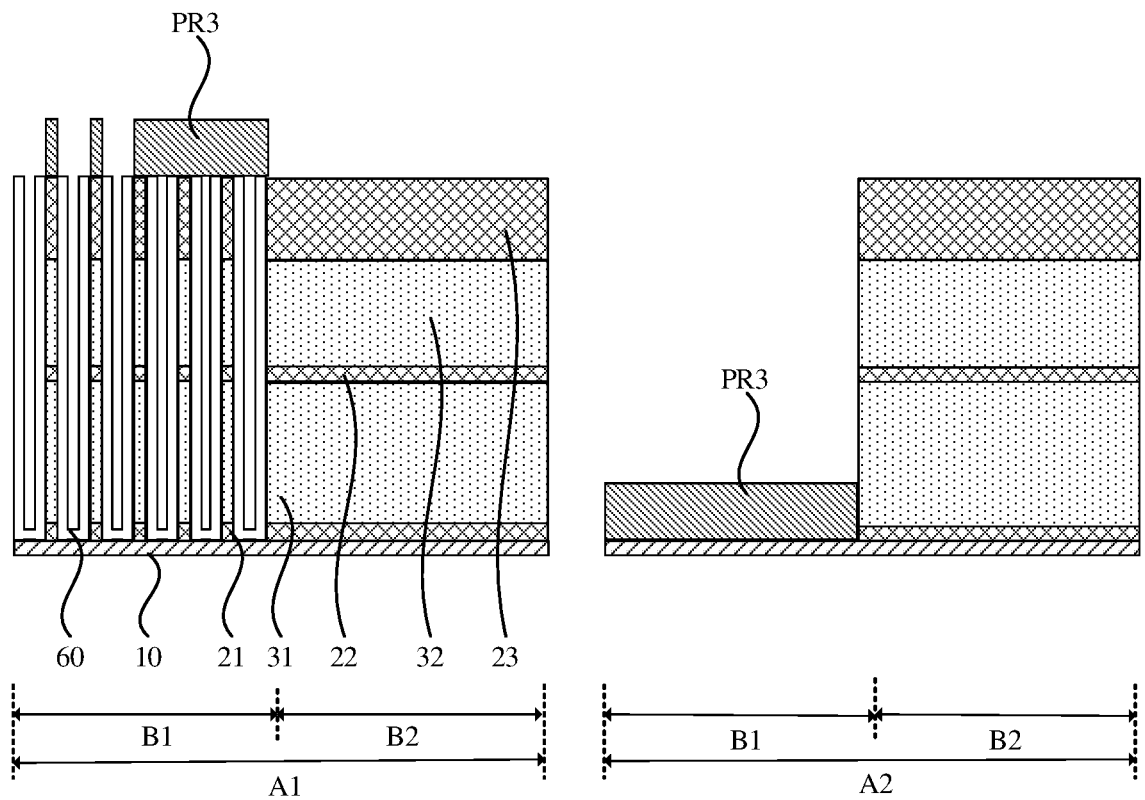
FIG. 17 is a schematic diagram of a third photoresist layer PR3 formed after implementing steps S207 and S208 of the manufacturing method of a semiconductor structure shown in FIG. 4.

In an embodiment, referring to FIG. 17, there is not a third pattern on the third photoresist layer PR3 on the incomplete die region A2. In other words, the third photoresist layer PR3 on the incomplete die region A2 is not patterned. Therefore, when the etching is carried out by using the third photoresist layer PR3 as a mask, the third photoresist layer PR3 on the incomplete die region A2 protects the device on the incomplete die region A2 from being patterned.

An embodiment of the present disclosure further provides a semiconductor structure, which is formed by a manufacturing method of a semiconductor structure provided by an embodiment of the present disclosure. In the embodiment of the present disclosure, the semiconductor structure is formed by the manufacturing method of a semiconductor structure provided by an embodiment of the present disclosure. The manufacturing method of a semiconductor structure includes the manufacturing method of a semiconductor structure in the above embodiment, which solves the problem that the edge of the wafer is prone to collapse and peeling during the formation of the semiconductor structure.

Figure 18:
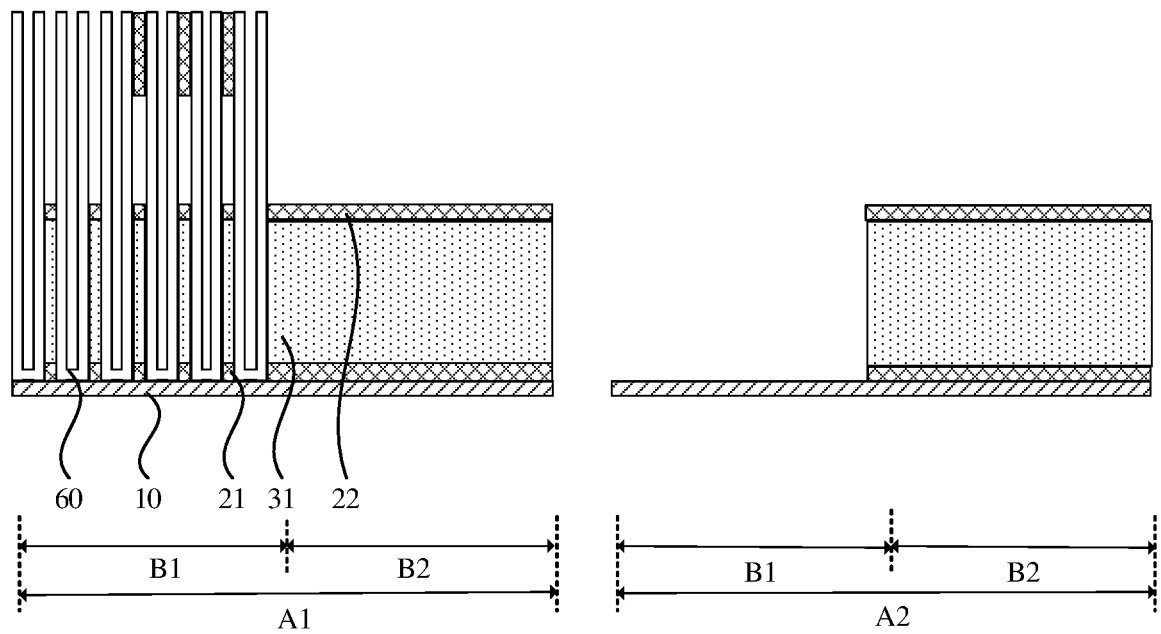
FIG. 18 is a schematic diagram of a semiconductor structure according to an embodiment of the present disclosure.

In an embodiment, referring to FIG. 18, the semiconductor structure includes a substrate 10, sacrificial layers and supporting layers which are alternately stacked, and a bottom electrode 60. The substrate 10 includes a complete die region A1 and an incomplete die region A2 located at the periphery of the complete die region A1. The alternately stacked sacrificial layers and supporting layers are located on the substrate 10. On the incomplete die region A2, there are more film layers in a peripheral region B2 than in a device region B1.

In an embodiment, referring to FIG. 18, the alternately stacked sacrificial layers and supporting layers include a first supporting layer 21, a first sacrificial layer 31, a second supporting layer 22, a second sacrificial layer 32 and a third supporting layer 23 along a direction away from the substrate 10. The first supporting layer 21, the first sacrificial layer 31 and the second supporting layer 22 are located in the peripheral region B2 of the complete die region A1 and the incomplete die region A2. The device region B1 of the incomplete die region A2 does not include the first supporting layer 21, the first sacrificial layer 31 and the second supporting layer 22. The device region B1 of the incomplete die region A2 includes the substrate 10.

A person skilled in the art can easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

INDUSTRIAL APPLICABILITY

In the manufacturing method of a semiconductor structure and the semiconductor structure provided by the present disclosure, the first photoresist layer is exposed and developed to remove the first photoresist layer on the incomplete die region and retain the first photoresist layer on the complete die region. Since the first photoresist layer on the incomplete die region is removed, no pattern will be formed on the first photoresist layer on the incomplete die region. When the stack on the substrate is etched, on the complete die region, the pattern can be transferred to the stack. On the incomplete die region, there is no patterned first photoresist layer, so the stack on the incomplete die region will not be patterned, thereby solving the problem that the edge of the wafer is prone to collapse and peeling during the formation of the semiconductor structure.

The invention claimed is:

1. A manufacturing method of a semiconductor structure, wherein the manufacturing method of the semiconductor structure comprises:
providing a substrate, wherein the substrate comprises a complete die region and an incomplete die region; the complete die region is composed of complete dies inside the substrate, and the incomplete die region is composed of incomplete dies at the periphery of the substrate, the incomplete die region is located at the periphery of the complete die region, the complete die is a die that is completely on the substrate, the incomplete die is a die that is partially on the substrate;
forming a stack on the substrate, wherein the stack comprises sacrificial layers and supporting layers;
forming a first photoresist layer on the stack, wherein the first photoresist layer is a positive photoresist layer;
exposing the first photoresist layer, wherein the first photoresist layer on the incomplete die region is exposed by using a step exposure method and developing to remove the first photoresist layer on the incomplete die region; and
etching the stack by using the first photoresist layer on the complete die region as a mask;
wherein the manufacturing method of the semiconductor structure further comprises:
forming a first mask layer on the stack, wherein the first photoresist layer is located on the first mask layer;
etching the first mask layer by using the first photoresist layer on the complete die region as a mask; and
etching the stack by using the first mask layer as a mask.

2. The manufacturing method according to claim 1, wherein the step exposure method is carried out without using a photomask, and a light spot in the step exposure method at least covers a single complete die.

3. The manufacturing method according to claim 2, wherein an area of the light spot in the step exposure method is smaller than an area of a single exposure unit.

4. The manufacturing method according to claim 1, wherein a light spot in the step exposure method exactly completely covers a single complete die.

5. The manufacturing method according to claim 1, wherein the exposing the first photoresist layer comprises:

exposing the first photoresist layer on the complete die region, and developing to form a first pattern on the first photoresist layer on the complete die region; and exposing the first photoresist layer on the incomplete die region, and developing to remove the first photoresist layer on the incomplete die region.

6. The manufacturing method according to claim 5, wherein an exposure of the first photoresist layer on the incomplete die region is carried out before the exposing the first photoresist layer on the complete die region.

7. The manufacturing method according to claim 5, wherein the first photoresist layer on the complete die region is exposed by using a photomask, and the first photoresist layer on the incomplete die region is exposed without using a photomask.

8. The manufacturing method according to claim 5, wherein the first photoresist layer on the complete die region is exposed by using an immersion lithography machine or an extreme ultraviolet lithography machine;

the first photoresist layer on the incomplete die region is exposed by using an I-line lithography machine or a KrF lithography machine.

9. The manufacturing method according to claim 5, wherein the manufacturing method further comprises:

etching to transfer the first pattern of the complete die region to the first mask layer and remove the first mask layer on the incomplete die region.

10. The manufacturing method according to claim 9, wherein the manufacturing method further comprises:

forming a second photoresist layer on the first mask layer having the first pattern; and exposing the second photoresist layer, and developing to form a second pattern on the second photoresist layer on the complete die region and remove the second photoresist layer on the incomplete die region.

11. The manufacturing method according to claim 10, wherein the manufacturing method further comprises:

etching the stack by using the first pattern and the second pattern as a mask to form capacitor holes in the stack; and forming bottom electrodes on bottoms and sidewalls of the capacitor holes.

12. The manufacturing method according to claim 11, wherein after the forming bottom electrodes on bottoms and sidewalls of the capacitor holes, the manufacturing method further comprises:

forming a third photoresist layer on the stack in the stack the capacitor holes are formed; and forming a third pattern on the third photoresist layer;

wherein, the third pattern at least intersects the bottom electrodes on the sidewalls of the capacitor holes.

13. The manufacturing method according to claim 10, wherein the second photoresist layer is a positive photoresist layer or a negative photoresist layer.

14. A semiconductor structure, formed by the manufacturing method of a semiconductor structure according to claim 1.

\* \* \* \* \*